United States Patent
Griswold et al.

(10) Patent No.: US 8,339,137 B2
(45) Date of Patent: Dec. 25, 2012

(54) NON-CARTESIAN UNDER-SAMPLED MULTI-ECHO MRI

(76) Inventors: Mark A. Griswold, Shaker Heights, OH (US); Jean A. Tkach, Cleveland Heights, OH (US); Gregory R. Lee, Cleveland Heights, OH (US)

(*) Notice: Subject to any disclaimer, the term of this patent is extended or adjusted under 35 U.S.C. 154(b) by 448 days.

(21) Appl. No.: 12/688,934

(22) Filed: Jan. 18, 2010

(65) Prior Publication Data

US 2011/0175610 A1 Jul. 21, 2011

(51) Int. Cl.
G01V 3/00 (2006.01)
(52) U.S. Cl. .................................................. 324/309
(58) Field of Classification Search ........... 324/300–322
See application file for complete search history.

(56) References Cited

U.S. PATENT DOCUMENTS

2009/0196478 A1* 8/2009 Lustig et al. ................... 382/131

* cited by examiner

Primary Examiner — Dixomara Vargas

(57) ABSTRACT

Example apparatuses and methods control a magnetic resonance imaging (MRI) apparatus to perform a non-Cartesian, under-sampled, multi-echo MRI process. One example process includes controlling the MRI apparatus to excite an object to be imaged using a multi-echo Gradient Recalled Echo (GRE) pulse sequence. The example process also includes controlling the MRI apparatus to acquire a data set from the object to be imaged as a function of performing a non-Cartesian, under-sampling acquisition. The data set includes data acquired at two or more echo times (TE) per repetition (TR) and an element in the data set is sampled two or more times as a function of a non-Cartesian trajectory that crosses itself at least once. The process also includes controlling the MRI apparatus to reconstruct an image of the object to be imaged from the data set. The image may map brain activity.

22 Claims, 15 Drawing Sheets

NON-CARTESIAN UNDER-SAMPLED MULTI-ECHO MRI

COPYRIGHT NOTICE

A portion of the disclosure of this patent document contains material that is subject to copyright protection. The copyright owner has no objection to the facsimile reproduction of the patent document or the patent disclosure as it appears in the Patent and Trademark Office patent file or records, but otherwise reserves all copyright rights whatsoever.

BACKGROUND

Functional magnetic resonance imaging (fMRI) is a type of MRI scan that measures the change of blood flow related to neural activity in the brain. fMRI relies on a blood oxygen level dependent signal. Blood flow to local vasculature that accompanies neural activity results in a local reduction in deoxyhemoglobin, which is paramagnetic. Thus, fMRI is one type of MRI that facilitates mapping brain activity.

fMRI has conventionally been performed using an echo planar imaging (EPI) Cartesian based approach. fMRI has conventionally suffered from limited coverage, limited speed, and spatial distortions in the image acquired in the limited coverage area. These undesirable effects are related, at least in part, to the fact that the center of k-space is only crossed once during a Cartesian acquisition and that there is only one effective time per TR (repetition time) in EPI.

These undesirable effects may be exacerbated when under-sampling occurs. Example aliasing artifacts associated with conventional Cartesian EPI fMRI are illustrated in FIG. 1. A fully-sampled sixty four line Cartesian acquisition 110 produces an image 120 with a point spread function 130. An under-sampled sixteen line Cartesian acquisition 140 produces an image 150 with a point spread function (PSF) 160. Note the aliasing artifacts in image 150.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Example apparatuses and methods perform non-Cartesian (e.g., radial) under-sampled MRI using a multi-echo (e.g., gradient recalled echo (GRE)) approach. The under-sampled MRI may acquire images used to map brain activity. Example apparatus and methods perform under-sampling to speed up MRI. Example apparatuses and methods use radial, or other non-Cartesian acquisitions, to mitigate issues with Cartesian under-sampling. With a radial acquisition, the acquisition passes through the center of k-space more than once. In one example non-Cartesian acquisition the trajectory will cross itself at least once. In another example non-Cartesian acquisition the trajectory will sample the same point two or more times. Example apparatuses and methods use a multi-echo approach where there are two or more TE per TR to facilitate improving image quality by selecting between data available at different TEs per TR.

Figure 2:
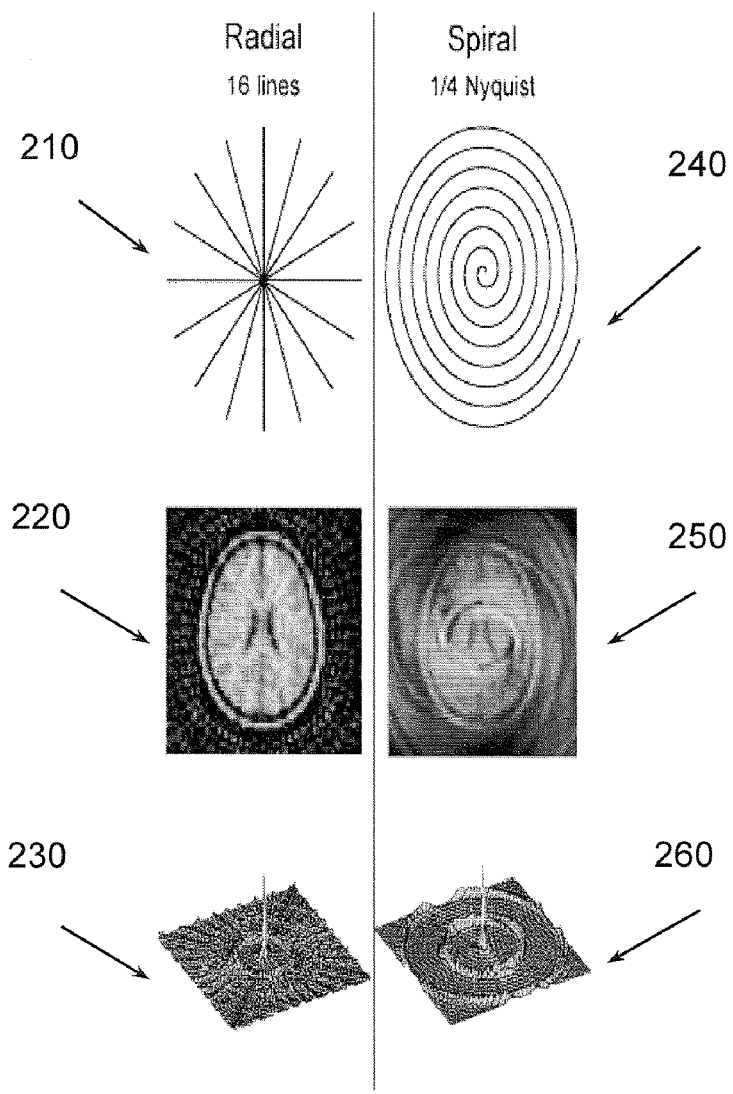
FIG. 2 illustrates results associated with non-Cartesian, under-sampled fMRI.

FIG. 2 illustrates a radial under-sampling pattern 210 that produces image 220 with a PSF 230. Note that the aliasing artifacts for acquisition 210 are incoherent. FIG. 2 also illustrates a spiral under-sampling pattern 240 that produces image 250 with PSF 260. The spiral pattern samples at ¼ the Nyquist criteria.

Figure 1:
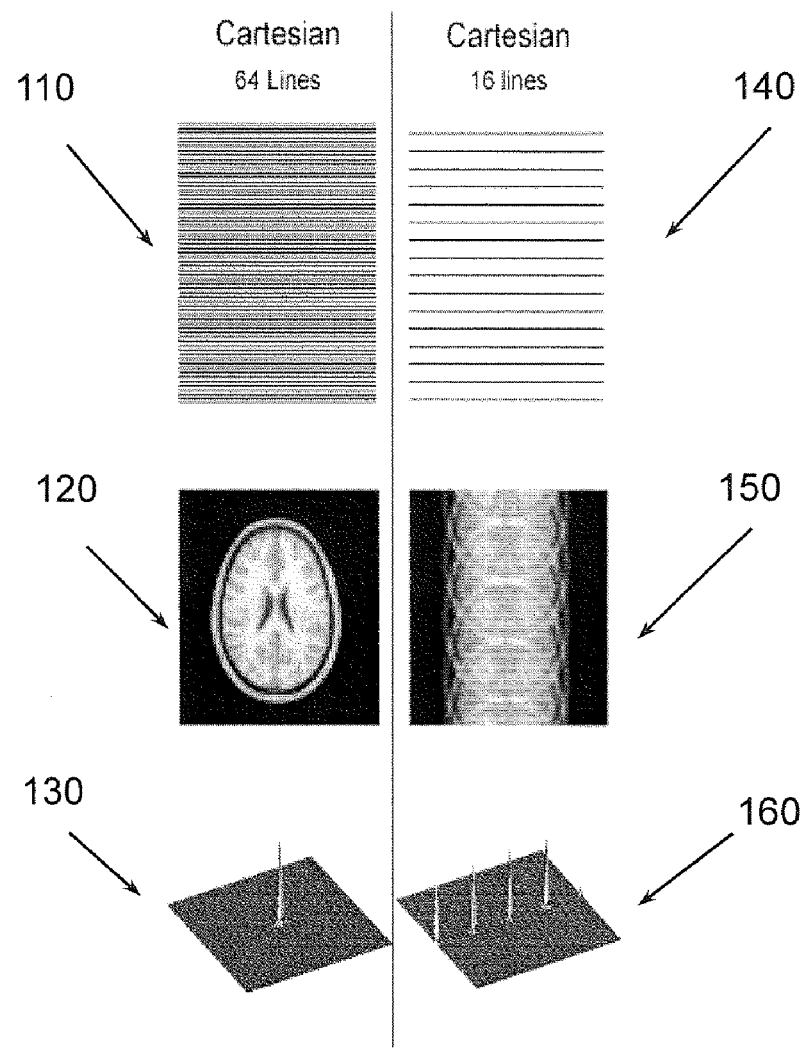
FIG. 1 illustrates results associated with conventional Cartesian EPI fMRI.

A point spread function (PSF) characterizes the performance of a linear system. The PSF illustrates what an intensity distribution for a single point object would look like if reconstructed from data corresponding to a sampling pattern. The image corresponding to any general object would then correspond to the convolution of the "true" image with this point spread function. The ideal point spread function is 1 at the center of the image and zero everywhere else. The PSF 130 associated with the fully sampled Cartesian EPI approach illustrated in FIG. 1 is an acceptable PSF.

For the fully sampled Cartesian case 110, there is only a single point in the center as desired and thus only one brain in image 120. For the under-sampling patterns (e.g., 140), the point spread function deviates from the ideal but in different ways. For the under-sampled Cartesian EPI 140, the replicas occur at regularly spaced intervals along the direction in which data was under-sampled. For the non-Cartesian cases (e.g., 210, 240) the aliasing pattern is spread out more diffusely. For patterns 210 and 240 there is still only a single main peak in the PSF with the aliasing energy distributed more diffusely in the side lobes.

Example apparatuses and methods perform a multi-echo readout using, for example, a GRE approach. Therefore, more than a single echo time (TE) is available per repetition (TR), and a TE yielding the desirable characteristics can be selected for a pixel. The TE or weighted combination of different TEs yielding the desirable characteristics can be selected as a function of pixel properties including, for example, tSNR (temporal signal to noise ratio), variance, and/or signal strength.

Figure 3:
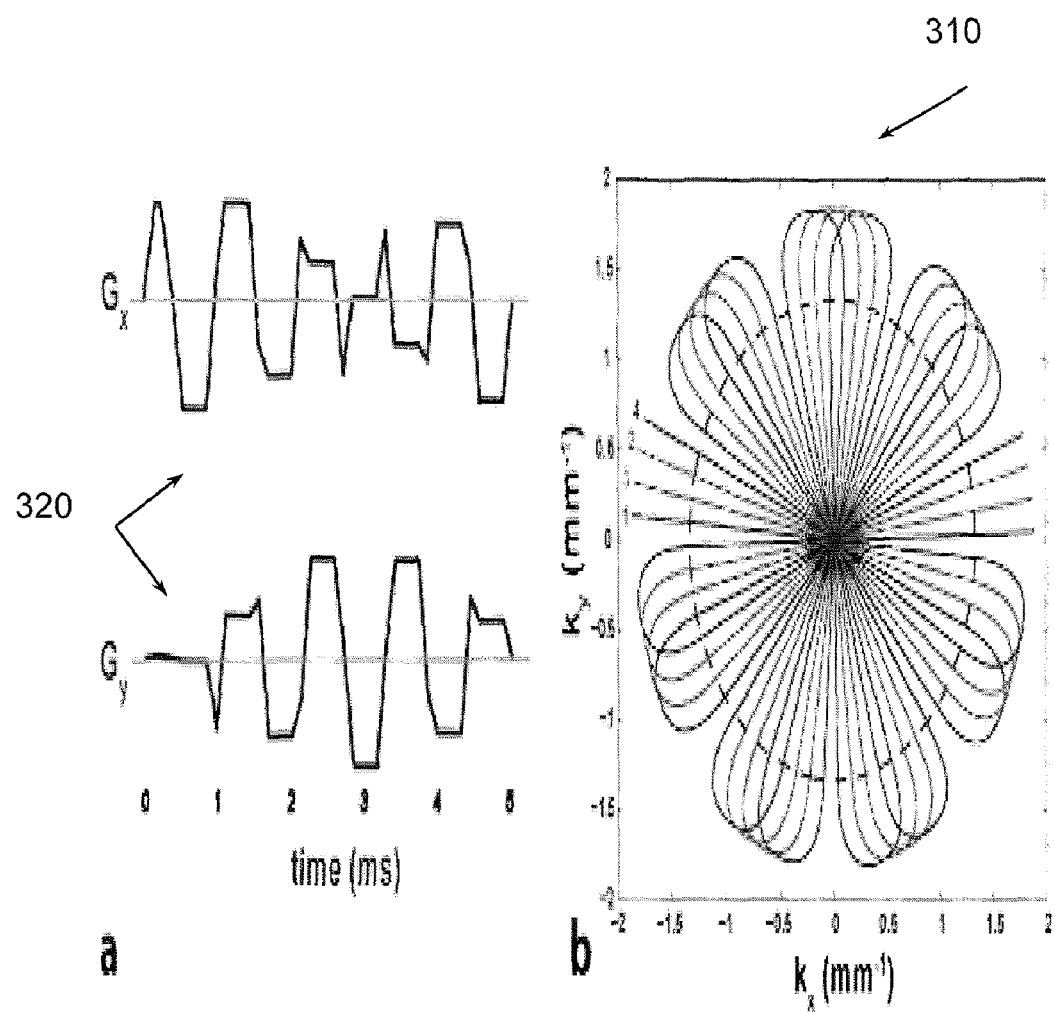
FIG. 3 illustrates a radial acquisition pattern associated with non-Cartesian, under-sampled, multi-echo, gradient recalled echo (GRE) MRI.

FIG. 3 illustrates a radial acquisition pattern 310 that passes through the center of k-space several times. Example apparatuses and methods may, in different embodiments, use between eight and sixteen radial lines per shot. An example shot may be from five to ten milliseconds in duration. A combination of eight to sixteen radial lines per five to ten millisecond shot may facilitate minimizing susceptibility-related dropouts. While a radial acquisition pattern 310 is illustrated, one skilled in the art will appreciate that other non-Cartesian acquisition patterns may be employed. FIG. 3 also illustrates X and Y gradients 320 associated with an interleaved radial EPI trajectory. Because the acquisition 310 crosses the center of k-space multiple times, there are multiple options for reading an echo.

Figure 4:
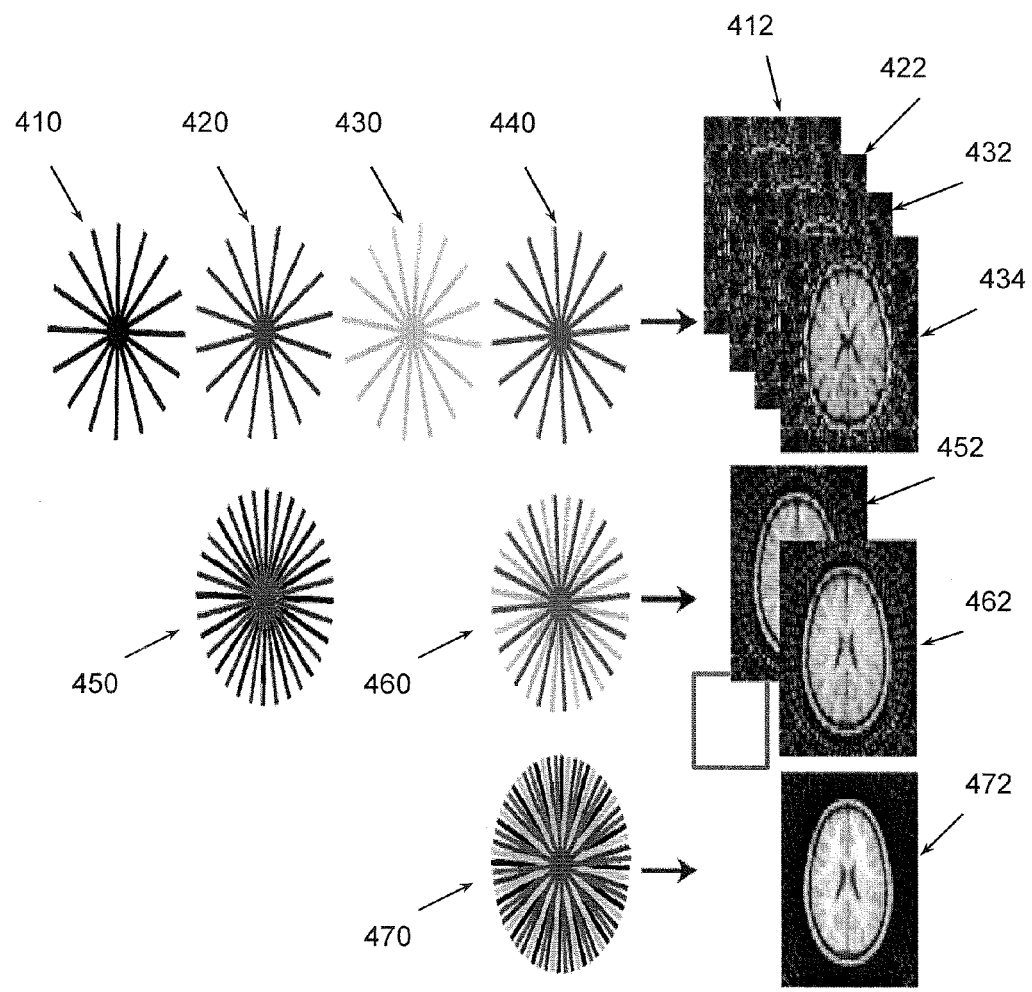
FIG. 4 illustrates interleafs associated with radial, under-sampled, multi-echo GRE fMRI.

FIG. 4 illustrates interleafs associated with a radial, under-sampled multi-echo MRI approach. In this approach several interleafs (e.g., 410, 420, 430, 440) can be acquired per TR. For example, interleafs 410, 420, 430, and 440 can be acquired at multiple TE values in one TR. The TE values can be separated by, for example, 5-10 ms in the one TR. The interleafs 410, 420, 430, and 440 could be used to produce images 412, 422, 432, and 442 respectively. Images from the multiple TEs could also be combined. The combination may involve, for example, summing interleafs using a weighted summation. Once again, while interleafs associated with a radial acquisition are illustrated, in other examples other non-Cartesian approaches may be employed.

In one example, interleafs 410 and 420 could be combined into combination 450, which is then used to produce image 452. Similarly, interleafs 430 and 440 could be combined into combination 460, which is then used to produce image 462. In yet another example, interleafs 410, 420, 430, and 440 could be combined into combination 470, which is then used to produce image 472. One skilled in the art will appreciate that different interleafs can be acquired with different sampling densities.

Combinations like combinations 450, 460, or 470 can be built in different ways. In one example, all the information from interleafs 410 and 420 can be combined into combination 450. In another example, a first selected portion of 410 and second selected portion of 420 could be combined into combination 450. The selected portions could be mutually exclusive or could have some overlap. The selected portions of 410 and 420 could be selected as a function of, for example, a sliding window approach. One skilled in the art will appreciate that other approaches could be employed to perform the described view sharing.

Figure 5:
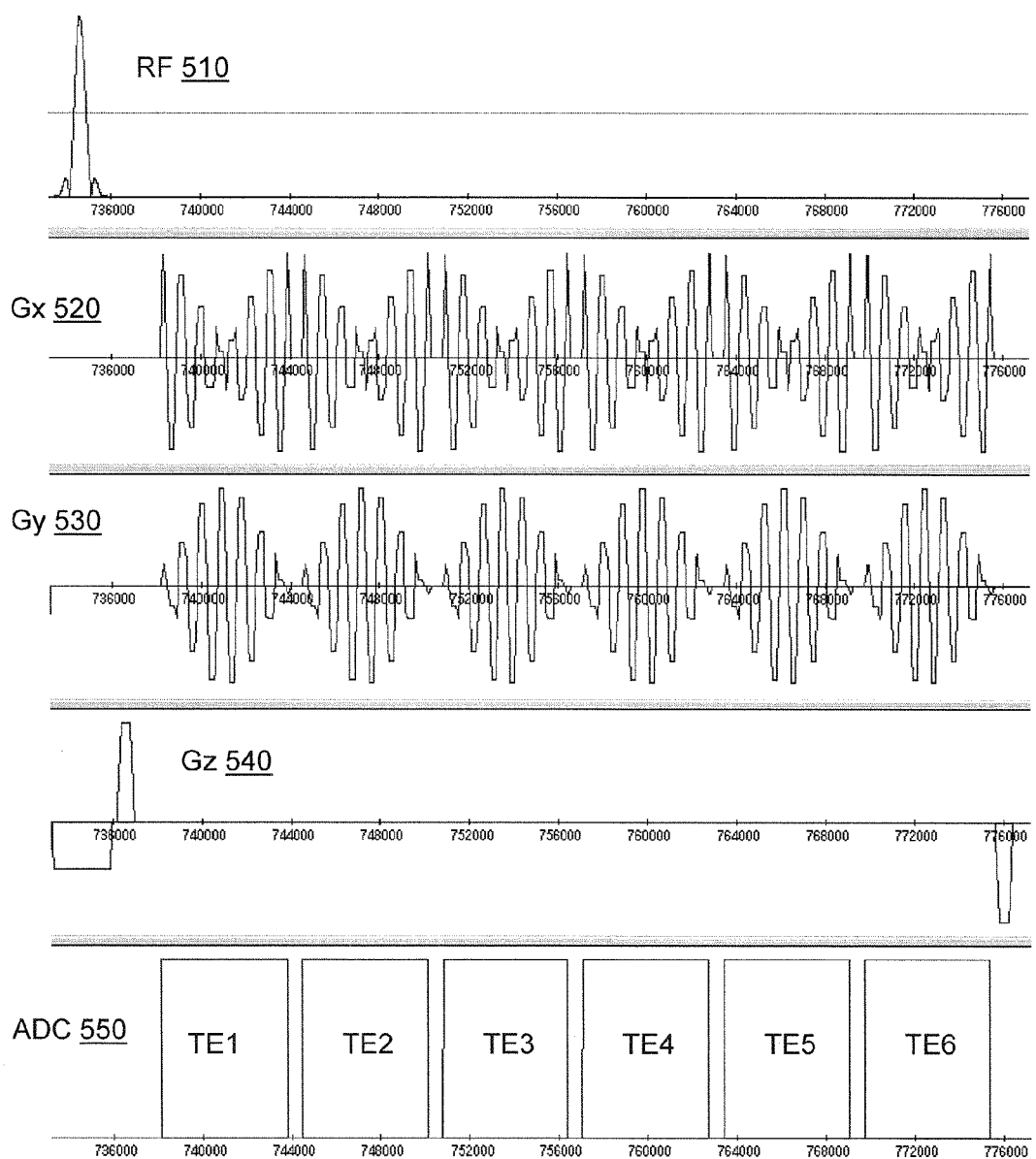
FIG. 5 illustrates an example multi-echo GRE pulse sequence.

FIG. 5 illustrates an example multi-echo GRE pulse sequence diagram 500. The multi-echo GRE pulse sequence is illustrated producing six echoes at times TE1, TE2, TE3, TE4, TE5, and TE6. The pulse sequence begins with an RF (radio frequency) pulse illustrated on trace 510. After the RF pulse, the sequence is bracketed with Z gradient action illustrated on Gz trace 540. Between the Z gradient bracketing activity, X and Y gradients are selectively and periodically manipulated as illustrated on Gx trace 520 and Gy trace 530. Analog to digital trace 550 illustrates signal acquisition at times TE1, TE2, TE3, TE4, TE5, and TE6. Thus the illustrated pulse sequence can have six echoes. One skilled in the art will appreciate that other multi-echo GRE pulse sequences could have a greater and/or lesser number of echoes generated by different manipulations of the X, Y, and Z gradients and by different RF pulses.

Figure 6:
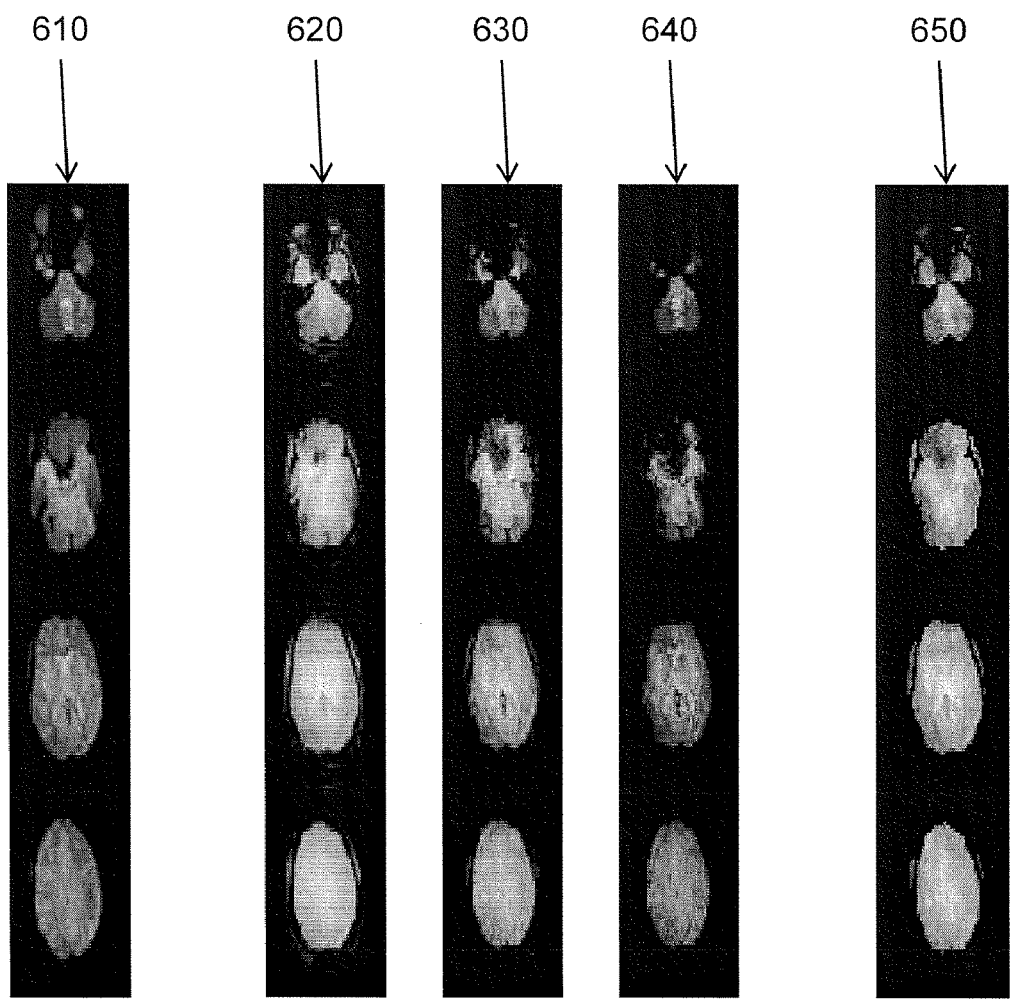
FIG. 6 illustrates EPI and radial, under-sampled, multi-echo GRE fMRI results.

FIG. 6 illustrates images of several slices acquired using different approaches. The images of slices illustrated in column 610 represent images acquired using an EPI approach. Columns 620, 630, and 640 illustrate images acquired using a radial acquisition and a multi-echo approach similar to that illustrated in FIG. 5. The images of slices illustrated in column 620 represent images acquired from a $1^{st}$ echo at TE=7 ms. The images of slices illustrated in column 630 represent images acquired from a $3^{rd}$ echo at TE=18 ms. The images of slices illustrated in column 640 represent images acquired from a $5^{th}$ echo at TE=30 ms. The images in column 650 are formed using a weighted average of data associated with the images in columns 620, 630, and 640.

Because a radial multi-echo approach that includes crossing the center of k-space more than once is used, there may be more than one choice for data to select to use to build a final image. Recall that in a Cartesian EPI approach, there was only one choice of data per pixel. There may also be more than one choice for data to select to use to build a final image when a non-Cartesian multi-echo approach that includes sampling a point two or more times is employed.

Having different data to choose from facilitates improving final image quality if the data is chosen wisely. Different tissues can produce different quality signals at different TEs. For example, at the first echo at TE=7 ms, a first tissue and/or region may produce a poor quality signal as compared to the signal for that tissue and/or region at the $5^{th}$ echo at TE=30 ms. Conversely, at the first echo at TE=7, a second tissue and/or region may produce a higher quality signal as compared to the signal for that tissue and/or region at the $3^{rd}$ echo at TE=18 ms. The signal quality can be measured using, for example, a tSNR measurement, a variance, a signal strength, and so on.

In one example, the value for a voxel I is computed as a weighted sum of the voxel magnitudes for all of the available echoes. For example, I can be computed according to:

$$I = \sum_{n=1}^{N} Wn \cdot In$$

where $$Wn = \frac{tSNRn \cdot TEn}{\sum_{n=1}^{N} (tSNRn \cdot TEn)}$$

where tSNR is the temporal signal to noise ratio, which corresponds to the mean voxel intensity over time, or the standard deviation over time.

Figure 7:
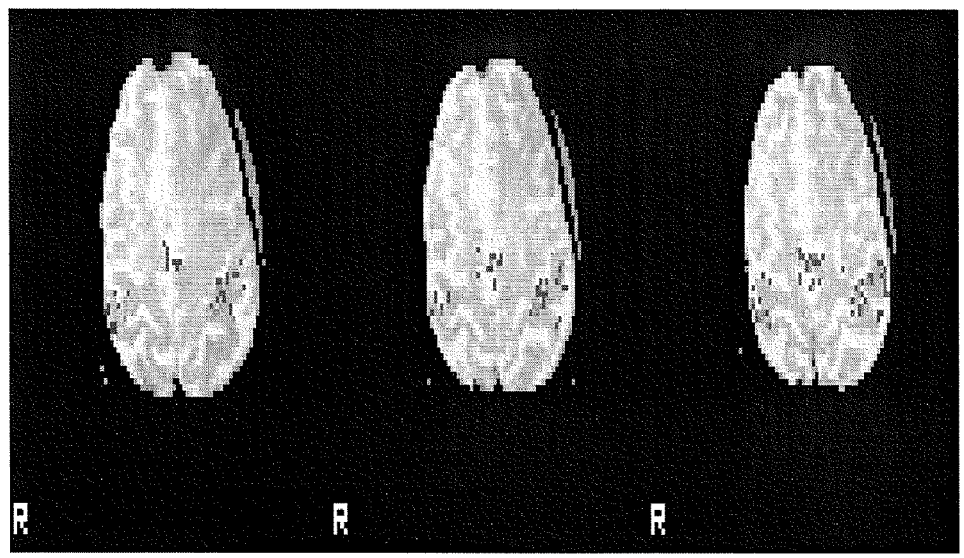
FIG. 7 illustrates example results from a radial, under-sampled, multi-echo GRE fMRI.
Figure 7:
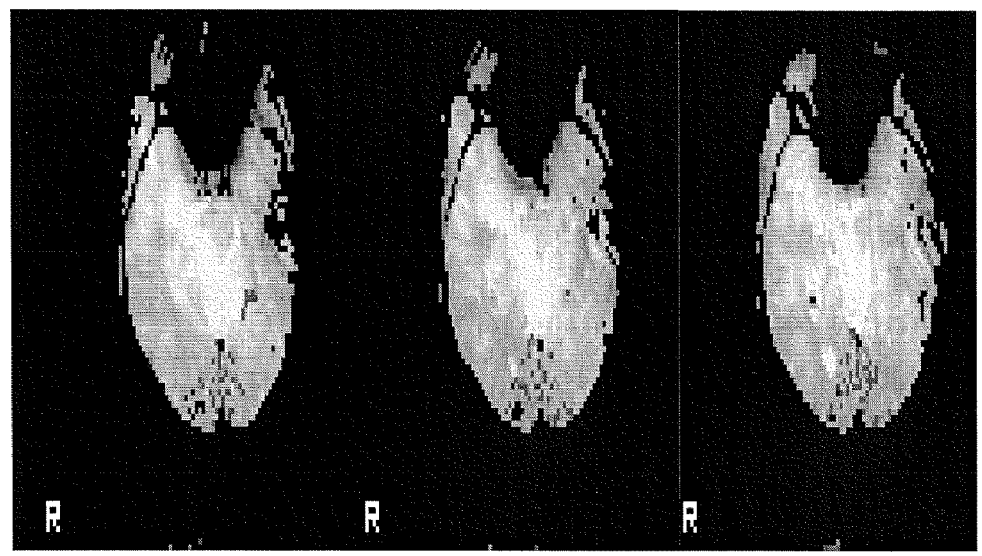

FIG. 7 illustrates example results from a five echo acquisition at a matrix size of 96×96. In this example, images were acquired at TEs of 9, 18, 27, 36, and 45 ms. Overall, a volume was acquired in 2.93 seconds per TR. Other example apparatuses and methods facilitate performing radial, under-sampled, multi-echo fMRI at less than 2.5 seconds per TR.

Conventional MRI, including fMRI, has been performed in two dimensions. Example apparatuses and methods facilitate performing under-sampled multi-echo non-Cartesian MRI in three dimensions. In a three dimensional approach, under-sampling can occur along an additional dimension.

Figure 8:
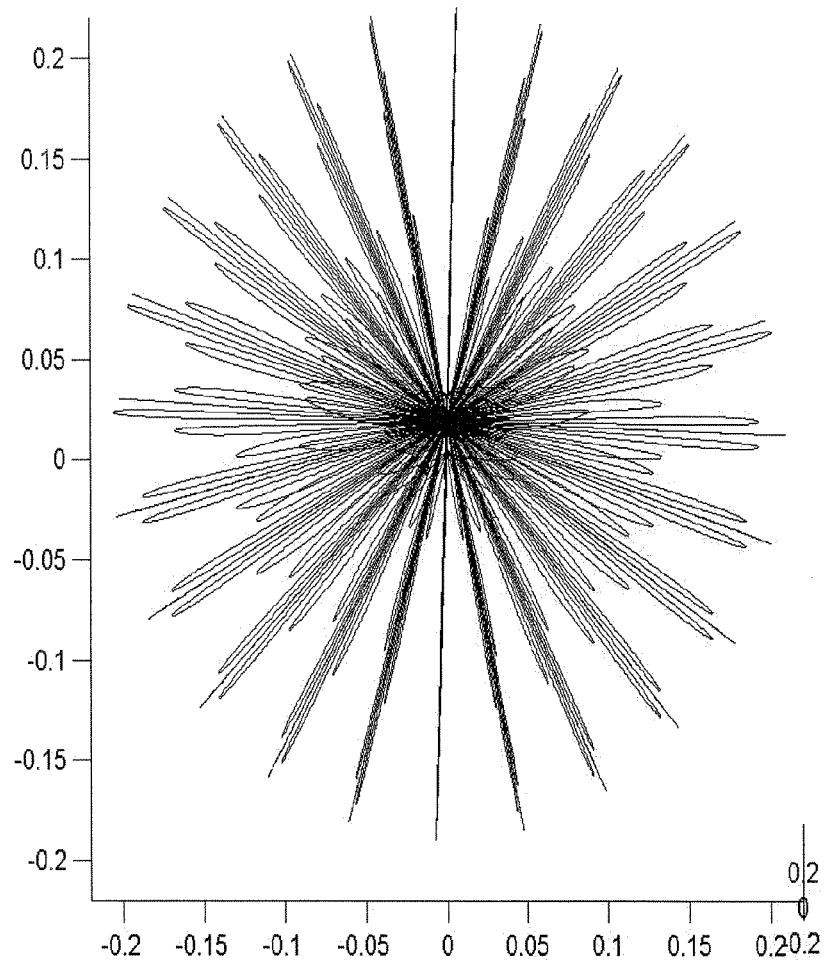
FIG. 8 illustrates a three-dimensional non-Cartesian acquisition scheme.

FIG. 8 illustrates one example three dimensional radial acquisition scheme. Notice that the center of k-space is crossed multiple times. In one example, a two dimensional shot is rotated about two orthogonal axes, and each shot will acquire the center of k-space. One skilled in the art will appreciate that three dimensional radial acquisition schemes different from that illustrated in figure eight may be employed. One skilled in the art will also appreciate that other non-Cartesian approaches that cross themselves at least once, or that sample a point more than once, while being non-radial, can be employed.

Figure 9:
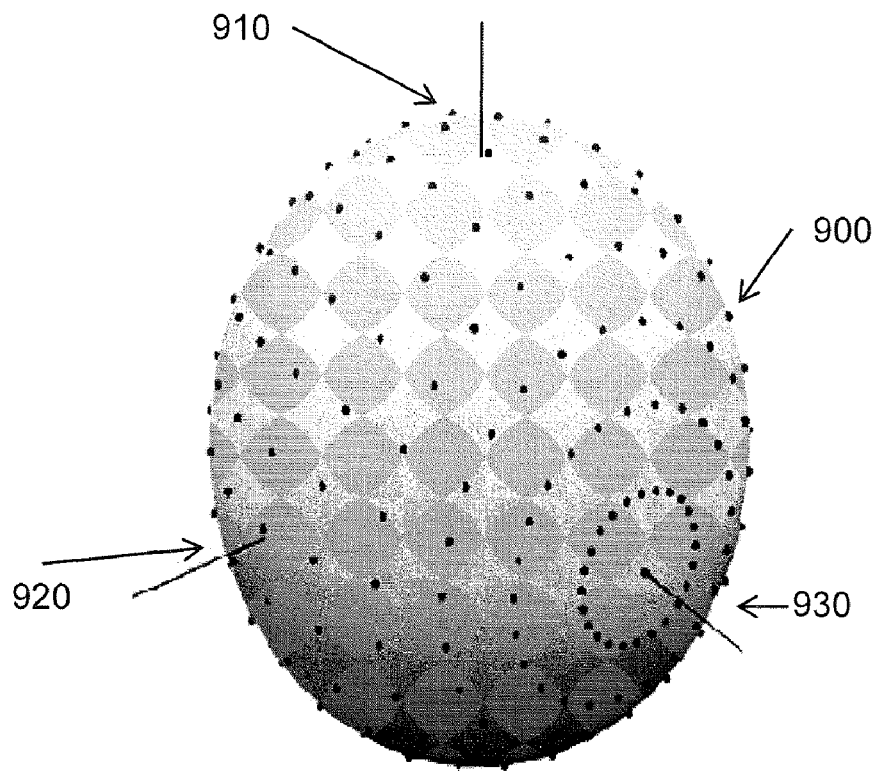
FIG. 9 illustrates a sphere.

FIG. 9 illustrates a sphere 900 with three axes 910, 920, and 930 projecting into sphere 900. The axis 930 is projected into a pole of sphere 900. Example apparatuses and methods will tend to over-sample near the poles of a sphere.

Figure 10:
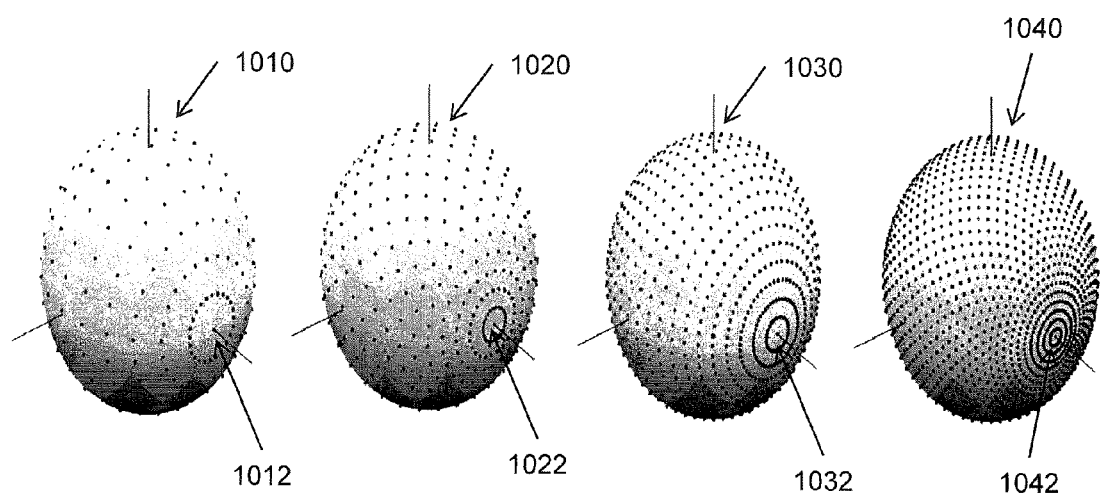
FIG. 10 illustrates spheres as processed by varying number of shots associated with non-Cartesian, under-sampled, multi-echo MRI.

FIG. 10 illustrates spheres as processed by varying numbers of shots. Sphere 1010 is processed by 12 shots and produces a first amount of over-sampling at pole 1012. Sphere 1020 is processed by 24 shots, which produces a second amount of over-sampling at pole 1022. Sphere 1030 is processed by 48 shots, which produces a third amount of over-sampling at pole 1032. Sphere 1040 is processed by 96 shots, which produces a fourth amount of over-sampling at pole 1044. When extending radial or other non-Cartesian under-sampled multi-echo MRI from two dimensions to three dimensions, example apparatuses and methods may be configured to have the number of shots be a power of two in each dimension.

Figure 11:
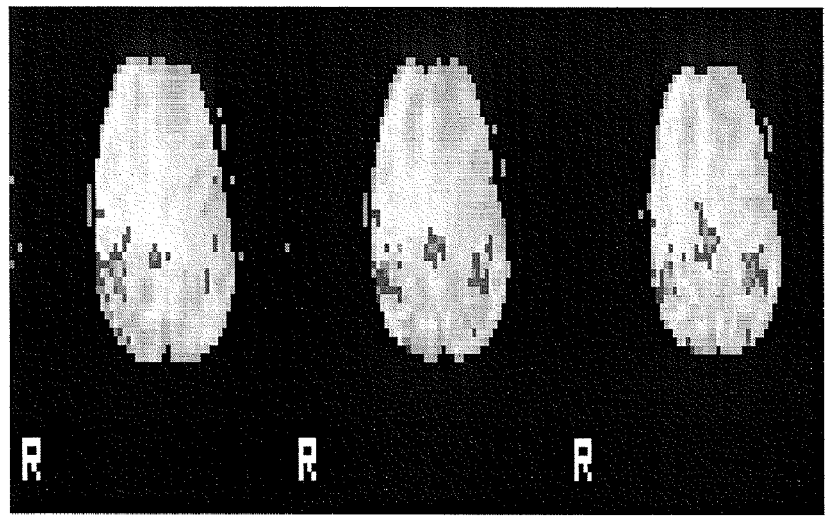
FIG. 11 illustrates results from a three-dimensional, non-Cartesian, under-sampled, multi-echo MRI.
Figure 11:
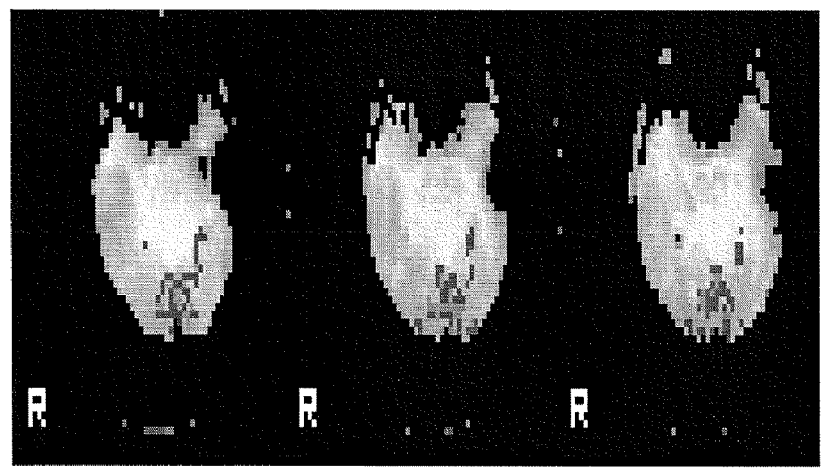

FIG. 11 illustrates results from a three dimensional example where a radial under-sampling multi-echo GRE approach was employed. In this example, a five echo approach was used, with images acquired at TEs of 10, 19, 28, 37, and 46 ms. In this example, sixteen two dimensional radial lines were acquired per single TR. In this example, sixteen TRs were used to form an under-sampled three dimensional k-space. Example apparatuses and methods were able to acquire a three dimensional volume in approximately one second using the under-sampling, radial, two or more echo time approach.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable medium", as used herein, refers to a medium that stores signals, instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

"Signal", as used herein, includes but is not limited to, electrical signals, optical signals, analog signals, digital signals, data, computer instructions, processor instructions, messages, a bit, a bit stream, or other means that can be received, transmitted and/or detected.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 12:
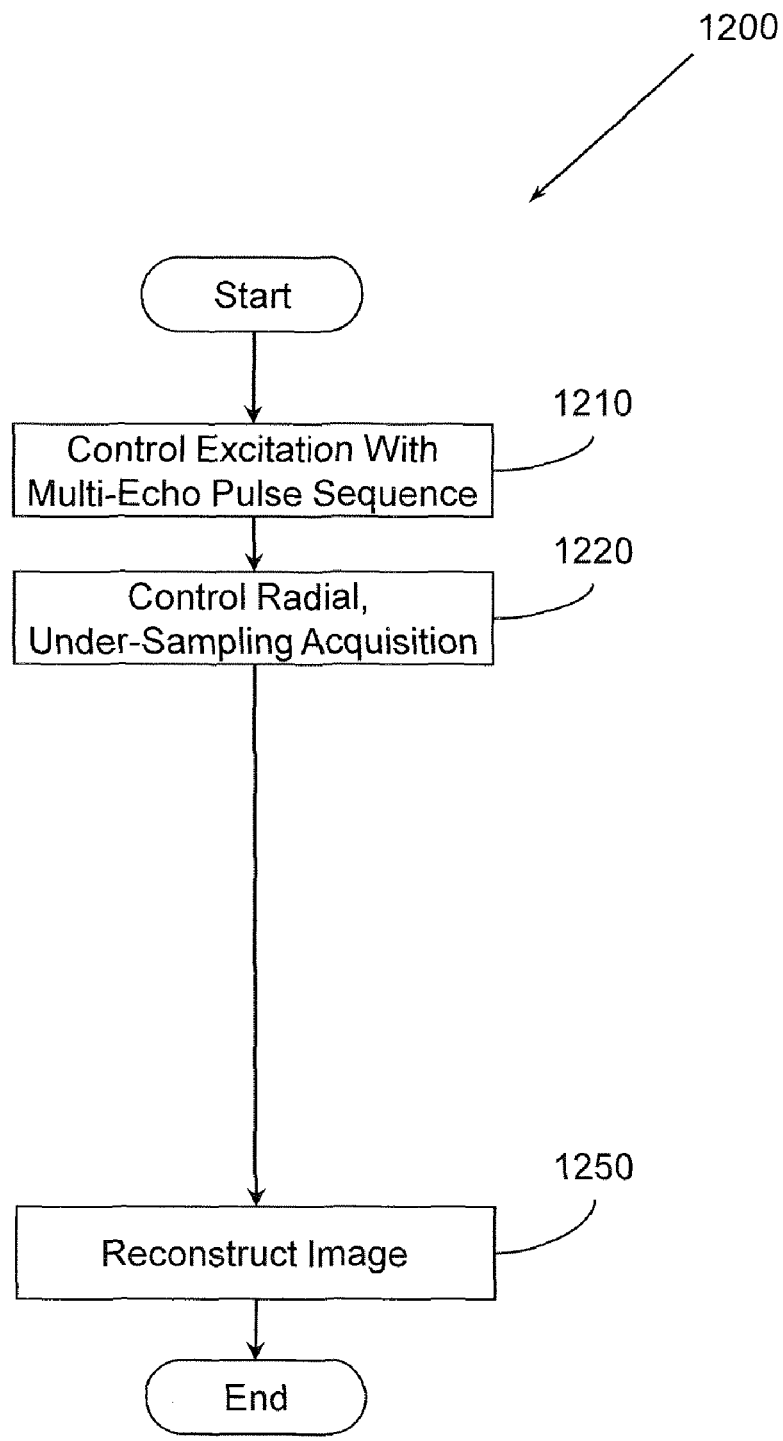
FIG. 12 illustrates a method associated with non-Cartesian, under-sampled, multi-echo MRI.

FIG. 12 illustrates a method 1200 associated with non-Cartesian (e.g., radial), under-sampling, multi-echo MRI. Method 1200 includes, at 1210, controlling an MRI apparatus to excite an object to be imaged using a multi-echo pulse sequence. In one example, the multi-echo pulse sequence is a Gradient Recalled Echo (GRE) pulse sequence. While at least two TE per TR is described, one skilled in the art will appreciate that a greater number of TE per TR can be employed. In one example, at least five TE per TR are acquired. The object to be imaged can be, for example, a human brain and an image produced can map brain activity.

Method 1200 also includes, at 1220, controlling the MRI apparatus to acquire a data set from the object to be imaged as a function of performing a non-Cartesian, under-sampling acquisition. In one example the non-Cartesian acquisition can be a radial acquisition. A data set will include data acquired at two or more TE per TR. A member of the data set will be sampled at two or more times using a non-Cartesian trajectory that crosses itself at least once.

In different examples the acquisition can be a two dimensional acquisition or a three dimensional acquisition. The three dimensional acquisition can be performed as, for example, a series of two dimensional shots that are rotated about two orthogonal axes. In this example, the two dimensional shots can be configured to acquire the center of k-space. In one embodiment, the acquisition is a two dimensional under-sampled acquisition performed in less than three seconds per TR per slice at a matrix size of 96×96. In another embodiment, the acquisition is a three dimensional under-sampled acquisition performed in less than one second per TR per volume at a matrix size of 96×96×96. One skilled in the art will appreciate that other matrix sizes and other TR lengths can be employed.

Method 1200 also includes, at 1250, controlling the MRI apparatus to reconstruct an image of the object to be imaged from the data set. In one embodiment, the data set may include data from at least eight radial lines per shot. The eight radial lines per shot may have been acquired in less than 5 ms per shot. In another embodiment, the data set may include data from at least sixteen radial lines per shot. The sixteen radial lines per shot may have been acquired in less than 10 ms per shot.

While FIG. 12 illustrates various actions occurring in serial, it is to be appreciated that various actions illustrated in FIG. 12 could occur substantially in parallel. By way of illustration, a first process could control excitation, a second process could control acquisition, and a third process could control reconstruction. While three processes are described, it is to be appreciated that a greater and/or lesser number of processes could be employed and that lightweight processes, regular processes, threads, and other approaches could be employed.

In one example, a method may be implemented as computer executable instructions. Thus, in one example, a computer-readable medium may store computer executable instructions that if executed by a machine (e.g., processor) cause the machine to perform method 1200. While executable instructions associated with the method 1200 are described as being stored on a computer-readable medium, it is to be appreciated that executable instructions associated with other example methods described herein may also be stored on a computer-readable medium.

Figure 13:
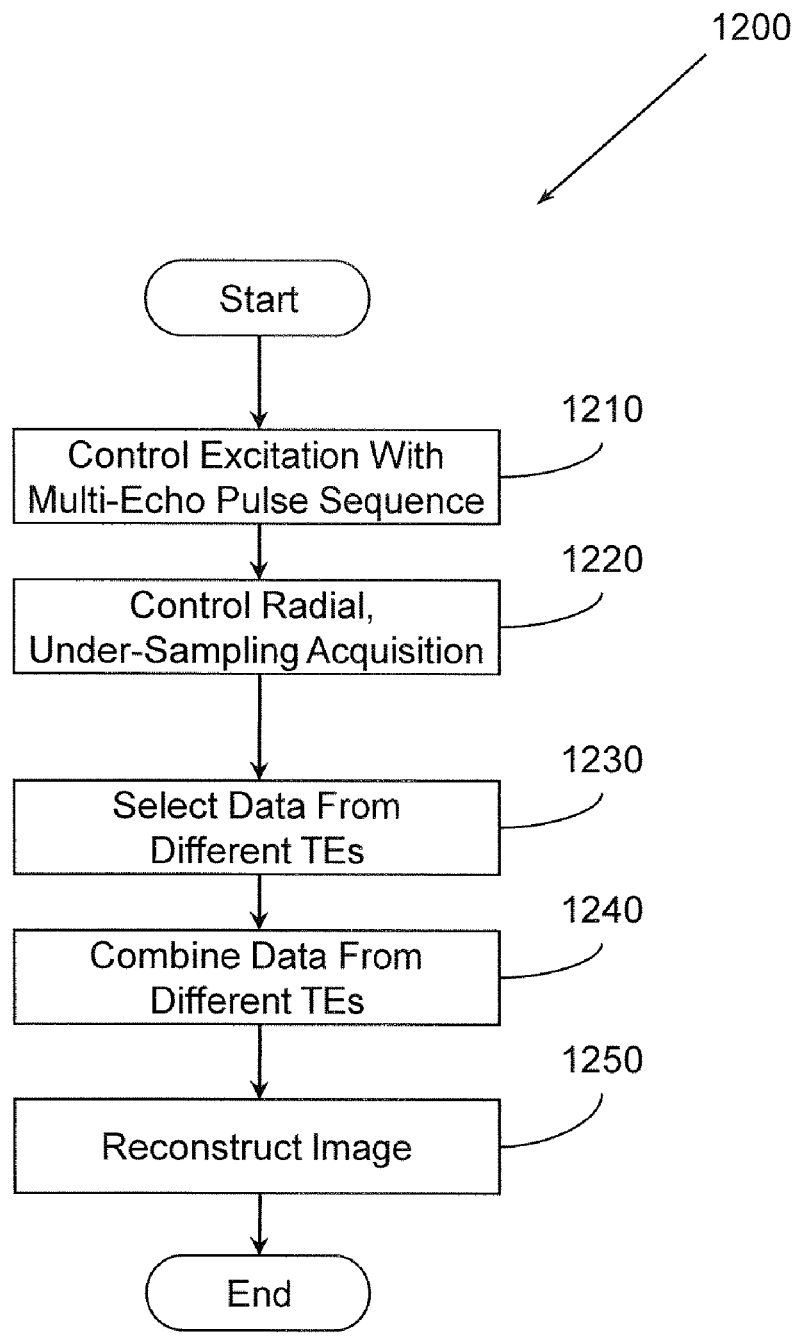
FIG. 13 illustrates a method associated with non-Cartesian, under-sampled, multi-echo MRI.

FIG. 13 illustrates another embodiment of method 1200. This embodiment includes, at 1230, selecting elements of the data set from which the image is to be reconstructed as a function of a pixel property. A member of the data set acquired at a first TE may have a first pixel property value while a corresponding member of the data set acquired at a second TE may have a second pixel property. The pixel property may be measured, for example, as a function of a temporal signal to noise ratio (tSNR), as a function of variance, as a function of signal strength, or using other measurements.

This embodiment also includes, at 1240, combining two or more corresponding elements of the data set from which the image is to be reconstructed. A first corresponding element is acquired at a first TE and a second corresponding element is acquired at a second TE. Data acquired at the different TEs can have different properties and choosing wisely between the available data facilitates improving the quality of a reconstructed image.

In one example, controlling the acquisition at 1220 can include controlling the MRI apparatus to acquire two or more interleafs per TR. The interleafs may have similar or different sampling densities. In one example, reconstructing the image at 1250 can include combining data from the two or more interleafs into a combination and then reconstructing the image as a function of the combination.

Figure 14:
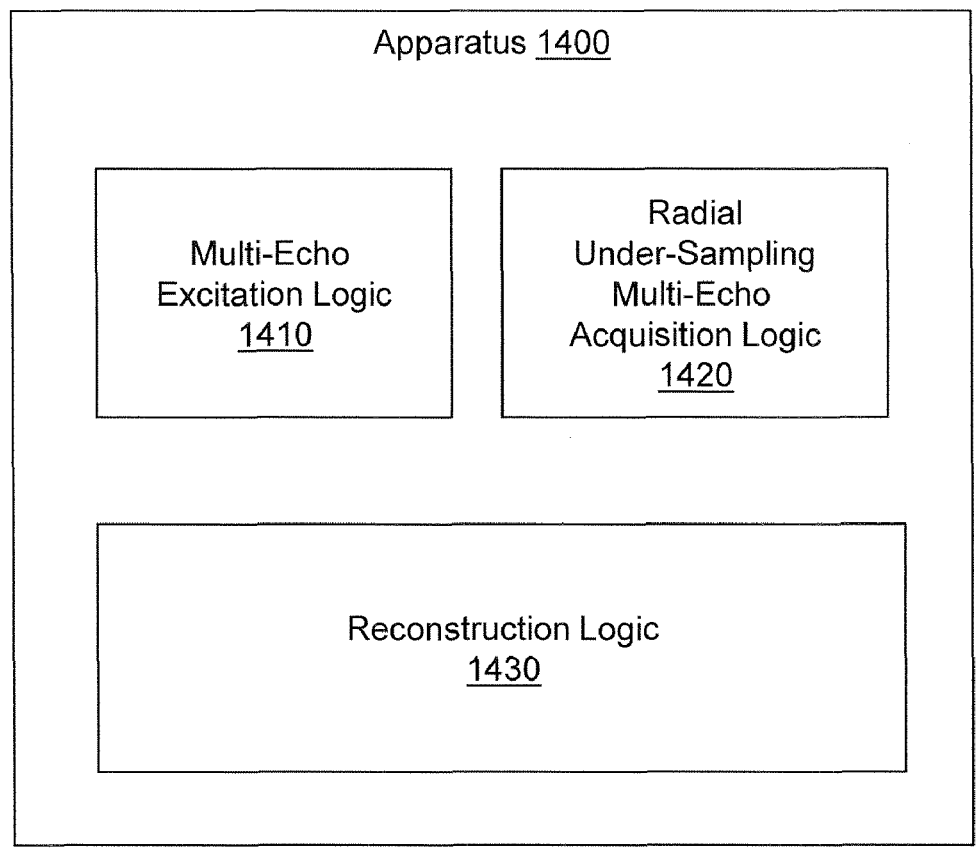
FIG. 14 illustrates an apparatus associated with non-Cartesian, under-sampled, multi-echo MRI.

FIG. 14 illustrates an apparatus 1400 associated with non-Cartesian, under-sampling, multi-echo MRI. Apparatus 1400 includes a multi-echo excitation logic 1410. Multi-echo excitation logic 1410 is configured to control an MRI apparatus to excite an object to be imaged using a multi-echo pulse sequence. The multi-echo pulse sequence can produce more than one TE per TR. The MRI apparatus may be, for example, an fMRI apparatus that produces a map of brain activity.

Apparatus 1400 also includes an acquisition logic 1420. The acquisition logic 1420 is configured to control the MRI apparatus to acquire a data set from the object to be imaged as a function of performing a non-Cartesian, under-sampling acquisition. The data set will be acquired so that it includes data acquired at two or more TEs per TR. A member of the data set will be sampled at two or more times using a non-Cartesian trajectory that crosses itself at least once.

Apparatus 1400 also includes a reconstruction logic 1430. The reconstruction logic 1430 is configured to control the MRI apparatus to reconstruct, from the data set, an image of the object. In one embodiment, the reconstruction logic 1430 is configured to select elements of the data set from which the image is to be reconstructed as a function of a pixel property. The pixel property can be measured as a function of one or more of, tSNR, variance, and signal. Recall that a member of the data set acquired at a first TE can have a first pixel property value while a corresponding member of the data set acquired at a second TE can have a second pixel property. In one embodiment, the reconstruction logic 1430 is configured to control the MRI apparatus to combine two or more corresponding elements of the data set from which the image is to be reconstructed. Once again, a first corresponding element is acquired at a first TE, and a second corresponding element is acquired at a second TE.

Figure 15:
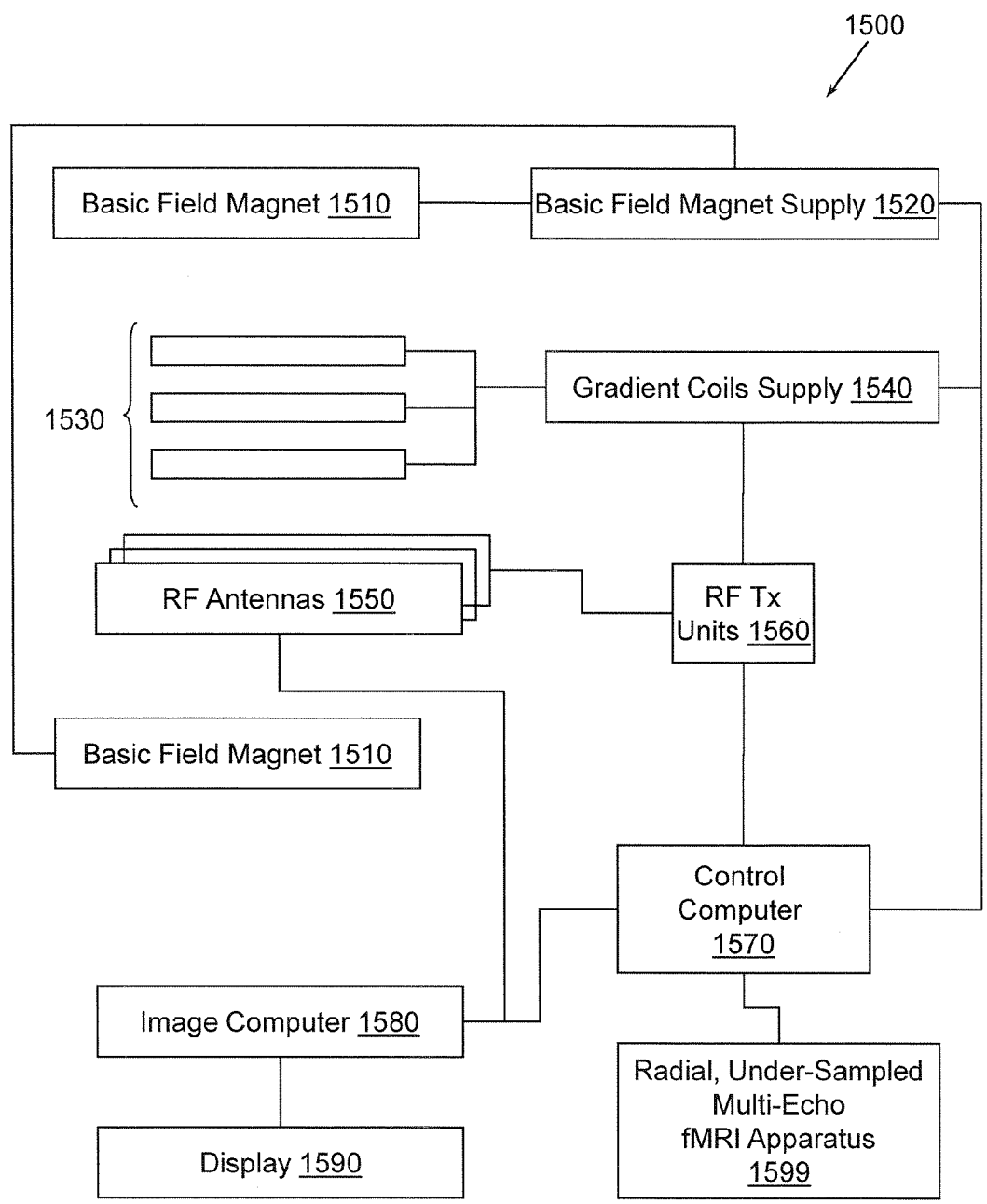
FIG. 15 illustrates an example MRI apparatus with which example apparatuses and methods may interact.

FIG. 15 illustrates an example MRI apparatus 1500 configured with a non-Cartesian, under-sampling, multi-echo MRI apparatus 1599. The apparatus 1599 may be configured with elements of example apparatus described herein and/or may perform example methods described herein. Apparatus 1599 may include means (e.g., hardware, software in execution, firmware, combinations thereof) for exciting an object to be imaged according to a multi-echo pulse sequence having a TR of less than one second. While a TR of less than one second is described, in different embodiments other TRs may be employed. Apparatus 1599 may also include means (e.g., hardware, software in execution, firmware, combinations thereof) for acquiring a non-Cartesian, under-sampled data set that includes data for at least two TE per TR. In one example, the under-sampled data set can be acquired at an acceleration factor of at least four. In some embodiments the acceleration factor may be as high as thirty-two. One skilled in the art will appreciate that other acceleration factors may be employed to acquire other data sets. Members of the data sets will be sampled at two or more times using a non-Cartesian trajectory that crosses itself at least once.

The apparatus 1500 includes a basic field magnet(s) 1510 and a basic field magnet supply 1520. Ideally, the basic field magnets 1510 would produce a uniform $B_0$ field. However, in practice, the $B_0$ field may not be uniform, and may vary over an object being imaged by the MRI apparatus 1500. MRI apparatus 1500 may include gradient coils 1530 configured to emit gradient magnetic fields like $G_S$, $G_P$ and $G_R$. The gradient coils 1530 may be controlled, at least in part, by a gradient coils supply 1540. In some examples, the timing, strength, and orientation of the gradient magnetic fields may be controlled and thus selectively adapted during an MRI procedure.

MRI apparatus 1500 may include a set of RF antennas 1550 that are configured to generate RF pulses and to receive resulting magnetic resonance signals from an object to which the RF pulses are directed. In some examples, how the pulses are generated and how the resulting MR signals are received may be controlled and thus may be selectively adapted during an MRI procedure. Separate RF transmission and reception coils can be employed. The RF antennas 1550 may be controlled, at least in part, by a set of RF transmission units 1560. An RF transmission unit 1560 may provide a signal to an RF antenna 1550.

The gradient coils supply 1540 and the RF transmission units 1560 may be controlled, at least in part, by a control computer 1570. In one example, the control computer 1570 may be programmed to control an fMRI device as described herein. The magnetic resonance signals received from the RF antennas 1550 can be employed to generate an image and thus may be subject to a transformation process. The transformation can be performed by an image computer 1580 or other similar processing device. The image data may then be shown on a display 1590. While FIG. 15 illustrates an example MRI apparatus 1500 that includes various components connected in various ways, it is to be appreciated that other MRI apparatus may include other components connected in other ways.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. A method for controlling a magnetic resonance imaging (MRI) apparatus, comprising:

controlling a magnetic resonance imaging (MRI) apparatus to excite an object to be imaged using a multi-echo pulse sequence;

controlling the MRI apparatus to acquire a data set from the object to be imaged as a function of performing a non-Cartesian, under-sampling acquisition, where the data set includes data acquired at two or more echo times (TE) per repetition (TR), and where an element in the data set is sampled two or more times; and controlling the MRI apparatus to reconstruct an image of the object to be imaged from the data set, where controlling the MRI apparatus to reconstruct the image of the object to be imaged from the data set comprises:

selecting elements of the data set from which the image is to be reconstructed as a function of a pixel property, where a member of the data set acquired at a first TE has a first pixel property value and where a corresponding member of the data set acquired at a second TE has a second pixel property, or combining two or more corresponding elements of the data set from which the image is to be reconstructed where a first corresponding element is acquired at a first TE and where a second corresponding element is acquired at a second TE.

2. The method of claim 1, the multi-echo pulse sequence being a Gradient Recalled Echo (GRE) pulse sequence.

3. The method of claim 2, where the object to be imaged is a human brain and where the image maps brain activity.

4. The method of claim 2, where the non-Cartesian, under-sampling acquisition is a three dimensional acquisition.

5. The method of claim 4, where the non-Cartesian, under-sampling acquisition is performed in less than 1 second per TR per volume at a matrix size of 96×96×96.

6. The method of claim 4, where the three dimensional acquisition is performed as a series of two dimensional shots rotated about two orthogonal axes.

7. The method of claim 6, where members of the series of two dimensional shots are configured to acquire the center of k-space.

8. The method of claim 7, where members of the series of two dimensional shots include a number of shots that are a power of two for each dimension.

9. The method of claim 1, where the multi-echo pulse sequence generates at least five TE per TR.

10. The method of claim 9, where the non-Cartesian, under-sampling acquisition is a two dimensional acquisition where a trajectory associated with the non-Cartesian acquisition crosses itself at least once.

11. The method of claim 9, where the non-Cartesian, under-sampling acquisition is performed in less than 3 seconds per TR per slice at a matrix size of 96×96.

12. The method of claim 1, where the data set includes data from at least eight radial lines per shot.

13. The method of claim 12, where data associated with a member of the at least eight radial lines per shot is acquired over a period of time less than 5 ms per shot.

14. The method of claim 1, where the data set includes data from at least sixteen radial lines per shot.

15. The method of claim 14, where data associated with a member of the at least sixteen radial lines per shot is acquired over a period of time less than 10 ms per shot.

16. The method of claim 1, where the pixel property is measured as a function of a temporal signal to noise ratio (tSNR).

17. The method of claim 1, where the pixel property is measured as a function of variance or signal.

18. An apparatus, comprising:
- a multi-echo excitation logic configured to control an MRI apparatus to excite an object to be imaged using a multi-echo pulse sequence;
- an acquisition logic configured to control the MRI apparatus to acquire a data set from the object to be imaged as a function of performing a non-Cartesian, under-sampling acquisition, where the data set includes data acquired at two or more echo times (TE) per repetition (TR), and where an element in the data set is sampled two or more times using a trajectory that crosses itself at least once; and
- a reconstruction logic configured to control the MRI apparatus to reconstruct an image of the object to be imaged from the data set, where the image of the object maps brain activity,
- where the reconstruction logic is configured to select elements of the data set from which the image is to be reconstructed as a function of a pixel property measured as a function of one or more of, temporal signal to noise ratio (tSNR), variance, and signal,
- where a member of the data set acquired at a first TE has a first pixel property value, and
- where a corresponding member of the data set acquired at a second TE has a second pixel property value.

19. The apparatus of claim 18, where the reconstruction logic is configured to control the MRI apparatus to combine two or more corresponding elements of the data set from which the image is to be reconstructed,
- where a first corresponding element is acquired at a first TE, and
- where a second corresponding element is acquired at a second TE.

20. A method for controlling a magnetic resonance imaging (MRI) apparatus, comprising:
- controlling a magnetic resonance imaging (MRI) apparatus to excite an object to be imaged using a multi-echo pulse sequence;
- controlling the MRI apparatus to acquire a data set from the object to be imaged as a function of performing a non-Cartesian, under-sampling acquisition, where the data set includes data acquired at two or more echo times (TE) per repetition (TR), and where an element in the data set is sampled two or more times; and
- controlling the MRI apparatus to reconstruct an image of the object to be imaged from the data set,
- where controlling the MRI apparatus to acquire the data set as a function of performing the non-Cartesian, under-sampling acquisition comprises controlling the MRI apparatus to acquire two or more interleafs per TR.

21. The method of claim 20, where controlling the MRI apparatus to reconstruct the image of the object to be imaged from the data set comprises controlling the MRI apparatus to combine data from the two or more interleafs into a combination and to reconstruct the image as a function of the combination.

22. The method of claim 20, where the two or more interleafs have different sampling densities.

* * * * *